United States Patent
Kim et al.

(10) Patent No.: US 7,773,649 B2
(45) Date of Patent: Aug. 10, 2010

(54) SEMICONDUCTOR LASER DIODE HAVING WAFER-BONDED STRUCTURE AND METHOD OF FABRICATING THE SAME

(75) Inventors: Kyu-sang Kim, Yongin-si (KR); Kyoung-ho Ha, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 2 days.

(21) Appl. No.: 11/878,347

(22) Filed: Jul. 24, 2007

(65) Prior Publication Data
US 2008/0049802 A1 Feb. 28, 2008

(30) Foreign Application Priority Data
Aug. 25, 2006 (KR) .................. 10-2006-0081173

(51) Int. Cl.
*H01S 5/00* (2006.01)
(52) U.S. Cl. .................. 372/43.01; 372/45.01
(58) Field of Classification Search ............... 372/50.1, 372/50.124, 43.01, 45.01
See application file for complete search history.

(56) References Cited

U.S. PATENT DOCUMENTS

| | | | | | |
|---|---|---|---|---|---|
| 5,513,204 | A | * | 4/1996 | Jayaraman | .................. 372/96 |
| 6,537,846 | B2 | | 3/2003 | Lee et al. | |
| 6,586,762 | B2 | * | 7/2003 | Kozaki | .................. 257/14 |
| 6,647,050 | B2 | * | 11/2003 | Yuen et al. | .................. 372/96 |
| 6,687,282 | B2 | * | 2/2004 | Kim et al. | .................. 372/96 |
| 6,920,164 | B2 | * | 7/2005 | Saitoh et al. | .................. 372/45.01 |
| 6,940,885 | B1 | * | 9/2005 | Cheng et al. | .................. 372/50.1 |
| 7,037,804 | B2 | | 5/2006 | Kellar et al. | |
| 2002/0093024 | A1 | * | 7/2002 | Lee et al. | .................. 257/98 |
| 2005/0040413 | A1 | * | 2/2005 | Takahashi et al. | .................. 257/96 |

FOREIGN PATENT DOCUMENTS

JP  2000-228562  8/2000

OTHER PUBLICATIONS

Notice of Non-Final Rejection in corresponding Korean Application No. 10-2006-0081173, with English translation.
Shi, et al.: "Interface structure and adhesion of wafer-bonded GaN/GaN and GaN/AlGaN semiconductors," J. Appl. Phys., vol. 95, No. 3. pp. 909-912 (Feb. 1, 2004).

* cited by examiner

*Primary Examiner*—Minsun Harvey
*Assistant Examiner*—Phillip Nguyen
(74) *Attorney, Agent, or Firm*—Harness, Dickey & Pierce, P.L.C.

(57) ABSTRACT

Example embodiments are directed to a semiconductor laser diode and a method of fabricating the same. The semiconductor laser diode may include a first semiconductor layer formed over a first substrate and capable of emitting light, and a second semiconductor layer capable of guiding the emitted light, wherein the first and second semiconductor layers are bonded to each other. The method of fabricating the semiconductor laser diode may include forming over a first substrate a first semiconductor layer capable of emitting light, forming over a second substrate a second semiconductor layer capable of guiding the light, bonding the first semiconductor layer to the second semiconductor layer, and removing the second substrate. The second semiconductor layer may be grown separately under conditions different from those for forming the first semiconductor layer, and may be subsequently bonded to the first semiconductor layer.

8 Claims, 8 Drawing Sheets

SEMICONDUCTOR LASER DIODE HAVING WAFER-BONDED STRUCTURE AND METHOD OF FABRICATING THE SAME

PRIORITY STATEMENT

This application claims priority under 35 USC §119 to Korean Patent Application No. 10-2006-0081173, filed on Aug. 25, 2006, in the Korean Intellectual Property Office (KIPO), the entire contents of which are herein incorporated by reference.

BACKGROUND

1. Field

Example embodiments relate to a semiconductor laser diode and a method of fabricating the same. Example embodiments also relate to a semiconductor laser diode having a wafer-bonded structure and a method of fabricating the same.

2. Description of the Related Art

Despite being small, semiconductor laser diodes may have lower threshold currents during laser oscillation than other laser devices. Semiconductor laser diodes may be widely applied in the field of telecommunications. They also may be applicable as devices with improved speed for data transmission or certain read/write functions in players using optical discs.

For example, gallium nitride (GaN)-based laser diodes may allow using wavelengths from the ultraviolet region to the visible-green region of the electromagnetic spectrum. GaN-based laser diodes may be applicable in various areas, including storage/reproduction devices using increased density optical information, laser printers with increased resolution, and projection televisions.

GaN-based laser diodes may have a structure including an n-$Al_xGa_{1-x}N$ layer, where $0 \leq x \leq 1$, an indium gallium nitride (InGaN) active layer, and a p-$Al_xGa_{1-x}N$ layer (an optical guide), where $0 \leq x \leq 1$. The p-$Al_xGa_{1-x}N$ layer may be formed in a multi-layered structure including an electron shield layer, a p-waveguide layer, a p-clad layer, and a p-contact layer.

However, the InGaN active layer may be grown at a temperature less than about 800° C., while the p-AlGaN layer formed above the InGaN active layer may be grown at a temperature in excess of about 900° C. Because the p-AlGaN layer may have a thickness of about 0.5 μm or more, the growth of the p-AlGaN layer may take longer than the other layers. When the p-AlGaN layer is grown at about 900° C. or more, the InGaN active layer (with an increased composition ratio of indium (In)) may be exposed to elevated temperature conditions for longer periods of time. Under these conditions, the InGaN active layer may be degraded, and/or a local segregation of In may take place.

Degradation and local segregation may often become severe in GaN-based laser diodes with long wavelengths extending into the visible-green region of the spectrum. More specifically, as the composition ratio of In in the InGaN active layer increases, the wavelength of emitted light may be lengthened and the growth temperature of the InGaN active layer may decrease. For those GaN-based laser diodes with long wavelengths and In-based active layers grown at lower temperatures, the growth temperature difference between the In-based active layer and the p-AlGaN layer may be increased. Accordingly, the degradation of the In-based active layer and/or the local segregation of In may become more severe as compared to other diodes.

If the growth temperature of the p-AlGaN layer is lowered to prevent or reduce the degradation of the active layer, the increased doping concentration of magnesium (Mg) may be limited. As the number of p-AlGaN layers formed above the active layer increases, lattice defects may also occur more frequently.

SUMMARY

Example embodiments relate to a semiconductor laser diode and a method of fabricating the same.

According to example embodiments, a semiconductor laser diode may include a first semiconductor layer configured to emit light and formed over a first substrate, and a second semiconductor layer configured to guide the emitted light, wherein the first and second semiconductor layers may be bonded to each other.

The second semiconductor layer may have a ridge waveguide structure or a gain guide structure.

The first semiconductor layer may include a first clad layer, a first waveguide layer, an active layer, a second waveguide layer, and a first bonding layer, which may be formed over the first substrate. The second semiconductor layer may include a second bonding layer bonded to the first bonding layer and a second clad layer formed over the second bonding layer.

The first and second semiconductor layers may include a material selected from the group consisting of GaN-based III-V nitride semiconductors.

According to example embodiments, a method of fabricating a semiconductor laser diode may include forming over a first substrate a first semiconductor layer configured to emit light, forming over a second substrate a second semiconductor layer configured to guide light, bonding the first semiconductor layer to the second semiconductor layer, and removing the second substrate.

The forming of the second semiconductor layer may include depositing a pre-sacrificial layer over the second substrate, stacking the second semiconductor layer on the deposited pre-sacrificial layer, and oxidizing the pre-sacrificial layer to form a sacrificial layer for removing the second substrate.

The first semiconductor layer may be formed by growing a first clad layer, a first waveguide layer, an active layer, a second waveguide layer, and a first bonding layer over the first substrate.

The second semiconductor layer may be formed by growing a second contact layer, a second clad layer, and a second bonding layer over the second substrate.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

FIG. 1 is a simplified cross-sectional view of a semiconductor laser diode according to example embodiments.

FIGS. 2 and 3 are respectively a cross-sectional view and an aerial view to illustrate forming the example first semiconductor layer illustrated in FIG. 1.

FIGS. 4A-4C and FIG. 5 are respectively cross-sectional views and an aerial view to illustrate forming the example second semiconductor layer illustrated in FIG. 1.

FIGS. 6 and 7 are respectively a cross-sectional view and an aerial view to illustrate a process of bonding the first and second example semiconductor layers to each other.

FIGS. 8 and 9 are respectively a cross-sectional view and an aerial view to illustrate a process of separating the second example substrate from the second example semiconductor layer.

DETAILED DESCRIPTION OF EXAMPLE EMBODIMENTS

Figure 1:
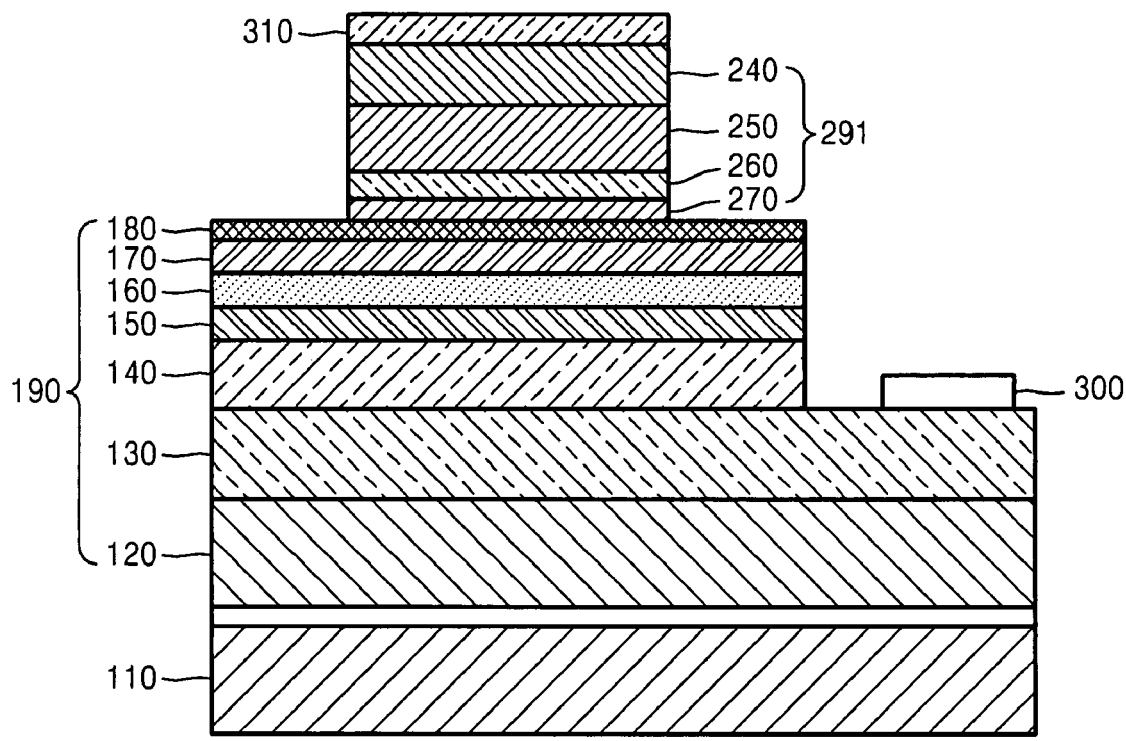

Example embodiments will now be described more fully with reference to the accompanying drawings, in which example embodiments are shown. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a simplified cross-sectional view of a semiconductor laser diode according to example embodiments. The semiconductor laser diode may include a first semiconductor layer 190 and a second semiconductor layer 291. The first semiconductor layer 190 may include an active layer 160 formed over a first substrate 110 and may emit light. The second semiconductor layer 291 may be coupled to the substrate structure 110 through the first semiconductor layer 190, and may guide the emitted light. According to example embodiments, the first semiconductor layer 190 and the second semiconductor layer 291 may have different growth conditions and be separately fabricated before being bonded together as one device. Thus, degradation of the first and second semiconductor layers 190 and 291 may be reduced.

The second semiconductor layer 291 may have a ridge-like waveguide structure in order to decrease the threshold current level for laser oscillation. Specifically, the second semiconductor layer 291 may have a width smaller than that of the first semiconductor layer 190, thereby acting as the ridge part of the ridge waveguide structure. The ridge waveguide structure may be used to guide the light emitted from the active layer 160, which may be a gain medium. The ridge waveguide structure may be one exemplary refractive index guide structure formed to generate a refractive index difference in the lateral direction. The second semiconductor layer 291 may have a gain guide structure. The gain guide structure may have a gain distribution determined by the distribution of injected carriers, and may guide the light based on the refractive index change caused by the distribution of the injected carriers and the refractive index change caused by heat generated during laser oscillation.

The first semiconductor layer 190 may include a first contact layer 130, a first clad layer 140, a first waveguide layer 150, the active layer 160, a second waveguide layer 170, and a first bonding layer 180, which may be formed over the first substrate 110 in sequential order. The second semiconductor layer 291 corresponding to the ridge-like part of the ridge waveguide structure may include a second bonding layer 270 that is to be bonded with the first bonding layer 180, a second clad layer 250 and a second contact layer 240. The second clad layer 250 and the second contact layer 240 may be sequentially formed on the second bonding layer 270. A first electrode 300 may be formed on one side of the first contact layer 130, and a second electrode 310 may be formed on top of the second contact layer 240.

In example embodiments, the first contact layer 130, the first clad layer 140 and the first waveguide layer 150 may be n-type semiconductors, while the second waveguide layer 170, the second bonding layer 180 and the second semiconductor layer 291 may be p-type semiconductors. However, these layers are not limited to only these n-type and p-type semiconductors; rather, these layers may also be formed in alternative semiconductors having inverse impurity types from the exemplary n-type and p-type semiconductors.

The second semiconductor layer 291 may further include a current shield layer 260 to shield electrons and prevent them from flowing to the second clad layer 250. The current shield layer 260 may be formed between the second bonding layer 270 and the second clad layer 250.

The semiconductor laser diode, according to example embodiments, may be a GaN-based laser diode. The first and second semiconductor layers 190 and 291 may be formed from a GaN-based III-V nitride semiconductor material. The first semiconductor layer 190 may include $In_yAl_xGa_{1-y-x}N$, where $0 \leq x \leq 1$, $0 < y \leq 1$, and $0 \leq x+y \leq 1$. The second semiconductor layer 291 may include $Al_xGa_{1-x}N$, where $0.5 < x \leq 1$, or $In_yAl_xGa_{1-y-x}N$, where $0 < x \leq 0.1$ and $0.5 < y \leq 1$. More particularly, the first contact layer 130, the first clad layer 140 and the first waveguide layer 150 may include an n-AlGaN/GaN layer, an n-GaN layer and an n-GaN layer, respectively. The active layer 160 may include an InGaN layer. The second waveguide layer 170, the first and second bonding layers 180 and 270, the second clad layer 250, and the second contact layer 240 may include a p-GaN layer, a p-InGaN layer, a p-AlGaN/GaN layer, and a p-InGaN layer, respectively.

The active layer 160 may have an increased composition ratio of In in order to lengthen the wavelength of the laser beam. According to example embodiments, because the second semiconductor layer 291 that may be grown at higher temperatures may be first fabricated separately and bonded with the first bonding layer 180, In diffusion or evaporation, which may occur when the conventional p-type semiconductor layer is grown, does not take place. Accordingly, a semiconductor laser diode with a long wavelength may be implemented without degrading the active layer 160, which may be a gain medium.

Also, because the second semiconductor layer 291 may be fabricated separately, lattice defects in the second semiconductor layer 291, which may be caused by growth temperature differences and/or strain differences, may be reduced. A sufficient amount of Mg doping may be added because the concentration of holes, which are carriers, may be increased. Thus, limitations in Mg doping, often arising when a conventional p-type semiconductor layer is grown, may be overcome.

As described above, the second semiconductor layer 291 may be fabricated separately from the first semiconductor layer 190. Therefore, when the second semiconductor layer 291 is grown, the composition ratio of aluminum (Al) content and the thicknesses of the individual layers of the second semiconductor layer 291 may be adjusted without degrading the first semiconductor layer 190. The composition ratio of Al content and the thicknesses of each of the layers may be correlated with the optical characteristics of the second semiconductor layer 291, which may guide the light. Thus, the semiconductor laser diode, according to example embodiments, may generate a mode of an oscillated laser beam.

As the composition ratios of In in the active layer 160 and Al in the second semiconductor layer 291 increase, generation of cracks and/or strain may become significant. Separate fabrication of the first and second semiconductor layers 190 and 291 may reduce the generation of cracks and/or strain.

The first substrate 110 may include one material selected from the group including sapphire, GaN, SiC, GaAs, and InP.

For example, if the first substrate 110 is formed of sapphire, a GaN-based semiconductor layer may need to be grown over the first substrate 110 without having a lattice defect. A first base layer 120 may be formed on the first substrate 110. The first base layer 120 may be obtained through a lateral growth from a PENDEO seed pattern (not illustrated) or an epitaxial lateral overgrowth (ELO) seed pattern (not illustrated) that may be formed on the first substrate 110. The first base layer 120 may include one material selected from the group including GaN, $Al_xGa_{1-x}N$, where $0 < x \leq 1$, and $In_yAl_xGa_{1-y-x}N$, where $0 < x \leq 1$ and $0 < y \leq 1$. Fabrication of the first and second semiconductor layers 190 and 291 will be described later.

If the first substrate 110 includes a conductive substrate, for example a GaN-based substrate, the first electrode 300 may be arranged at the rear side of the first substrate 110, and the first contact layer 130 may not be formed.

With reference to FIGS. 2 to 9, fabrication of the semiconductor laser diode will be described in more detail.

The first semiconductor layer 190 and the second semiconductor layer 291 may be fabricated over separate substrates.

Figure 2:
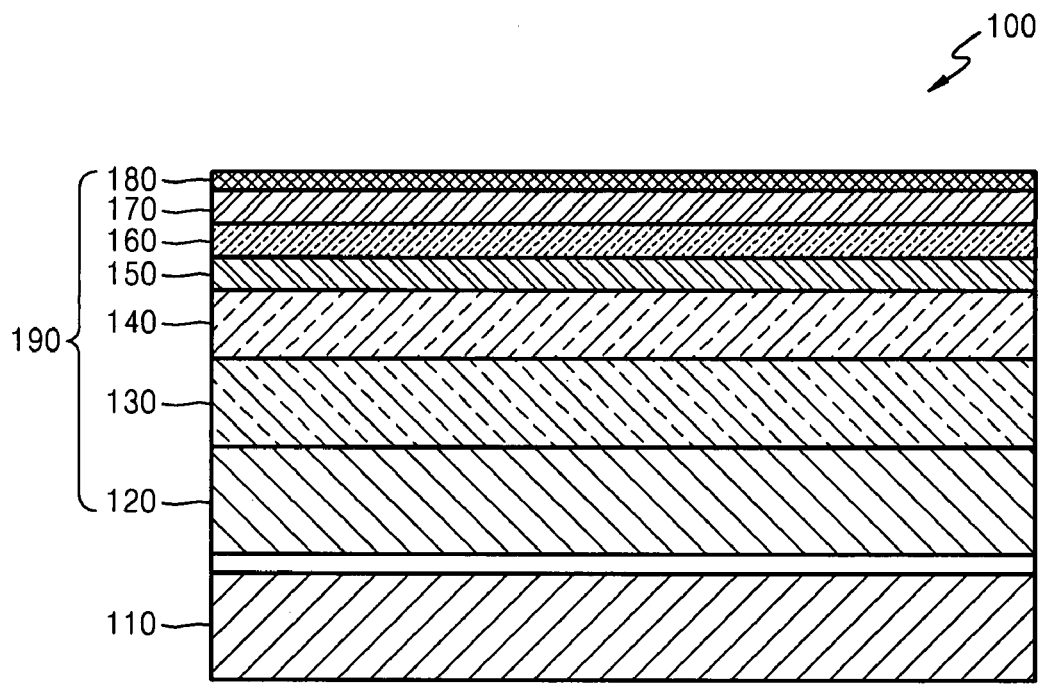
Figure 3:
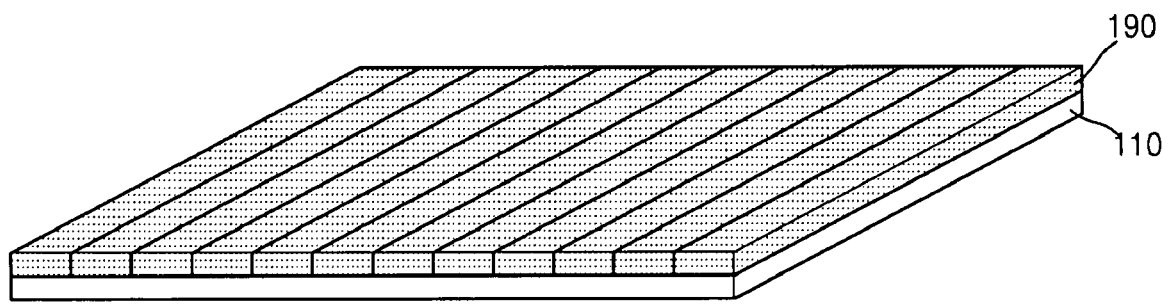

FIGS. 2 and 3 illustrate example processes of fabricating the first semiconductor layer 190 shown in FIG. 1. Particularly, FIG. 2 illustrates a cross-sectional view of the first semiconductor layer 190 formed over the first substrate 110. FIG. 3 illustrates a simplified aerial view of the semiconductor layer 190.

A first device 100 may be obtained by growing the individual layers of the first semiconductor layer 190 based on a method of stacking homogeneous materials (for example, growth of GaN-based crystal layers over a GaN-based substrate) or heterogeneous materials (for example, growth of GaN-based crystal layers over a sapphire-based substrate). The first semiconductor layer 190 may be formed by sequentially growing the first contact layer 130, the first clad layer 140, the first waveguide layer 150, the active layer 160, the second waveguide layer 170, and the first bonding layer 180 over the first substrate 110.

The first semiconductor layer 190 may include one selected from a group of GaN-based III-V nitride semiconductors, for example $In_yAl_xGa_{1-y-x}N$, where $0 \leq x \leq 1$, $0 \leq y \leq 1$ and $0 \leq x+y < 1$.

The first contact layer 130, the first clad layer 140 and the first waveguide layer 150 may include an n-GaN layer or n-GaN/AlGaN layers.

The active layer 160 may include an InGaN layer. The active layer 160 may have a multi-quantum well (MQW) or single quantum well structure. It should be noted that this quantum well structure does not limit the scope of example embodiments. For example, the active layer 160 may be formed in a GaN/InGaN/GaN MQW structure.

The second waveguide layer 170 and the first bonding layer 180 may include a p-GaN layer and a p-InGaN layer, respectively.

Each of the individual layers of the second semiconductor layer 291 may be formed using a vapor deposition method selected from a physical vapor deposition (PVD) method, a chemical vapor deposition (CVD) method and/or an evaporation method.

The first substrate 110 may include a material selected from the group including sapphire, GaN, SiC, GaAs, and InP.

As illustrated in FIG. 2, if the first substrate 110 is a sapphire substrate, the GaN-based semiconductor layer may be grown over the first substrate 110 using ELO or PENDEO epitaxy (PE) in order to prevent or reduce lattice defects.

If ELO is used, although not illustrated, a $SiO_2$ mask may be patterned over the GaN layer that is grown over the first substrate 110 in order to form an ELO first seed pattern. GaN or impurity doped GaN may be grown using, for example, a metal organic chemical vapor deposition (MOCVD) method or a hydride vapor phase epitaxy (HVPE) method. If ELO is used for the lateral growth, lattice defects initially generated in the GaN layer may not be generated again. Hence, the GaN-based semiconductor layer may be fabricated with a reduced number of defects.

Although not illustrated, if PE is used as another method of preventing or reducing lattice defects, the GaN layer grown over the first substrate 110 may be etched to form a PENDEO first seed in a striped pattern. GaN or impurity doped GaN may be re-grown laterally or vertically from the PENDEO first seed pattern to form the first base layer 120.

The ELO or PENDEO first seed pattern may include one selected from a group of GaN-based III-V nitride semiconductors. Particularly, the ELO first seed pattern may include one selected from the group including GaN, $Al_xGa_{1-x}N$, where $0<x\leq1$, and $In_yAl_xGa_{1-y-x}N$, where $0<x\leq1$ and $0<y\leq1$.

In the first semiconductor layer 190, a GaN-based semiconductor material formed over the first base layer 120 may be grown through a monolith or re-growth method.

Figure 4A:
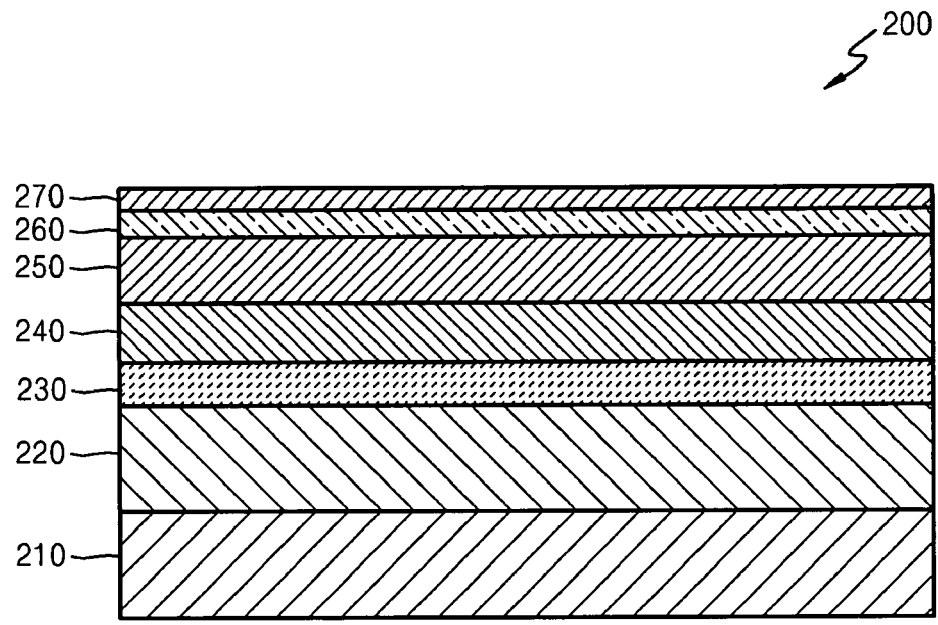
Figure 4B:
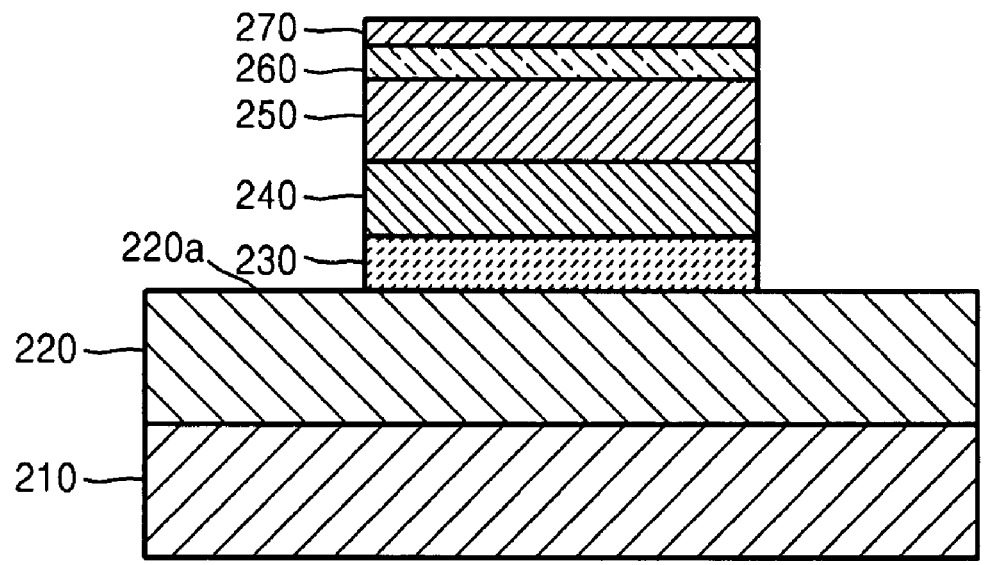
Figure 4C:
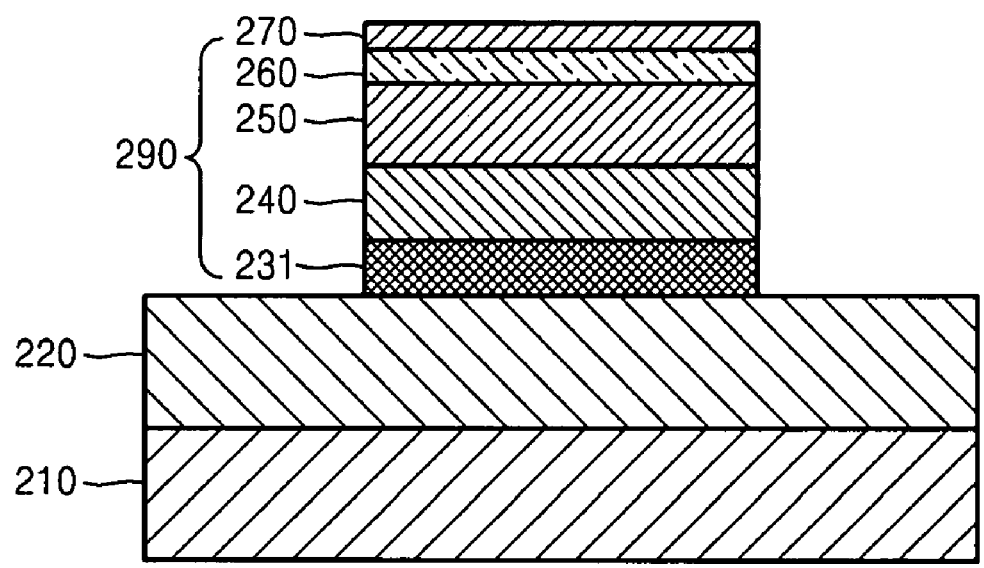
Figure 5:
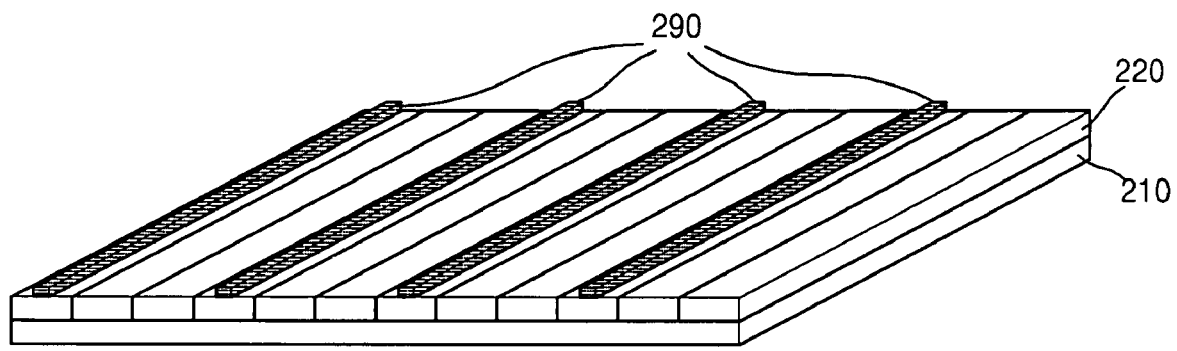

FIGS. 4A through 4C and FIG. 5 illustrate example processes of fabricating the second semiconductor layer 291 illustrated in FIG. 1. Particularly, FIGS. 4A through 4C illustrate simplified cross-sectional views of the second semiconductor layer 291 illustrated in FIG. 1, and FIG. 5 illustrates a simplified view of the second semiconductor layer 291 from the wafer perspective.

Referring to FIG. 4A, a second device 200 may be obtained by sequentially growing the individual layers of the second semiconductor layer 291 over a second substrate 210 using a method of growing a GaN-based crystal layer. In more detail, the second semiconductor layer 291 may be formed by sequentially growing a pre-sacrificial layer 230, the second contact layer 240, the second clad layer 250, the current shield layer 260, and the second bonding layer 270 over the second substrate 210.

The second semiconductor layer 291 may include a material selected from the group including GaN-based III-V nitride semiconductors. For example, the second semiconductor layer 291 may include $Al_xGa_{1-x}N$, where $0.5<x\leq1$, or $In_yAl_xGa_{1-y-x}N$, where $0<x\leq0.1$ and $0.5<y\leq1$.

The second contact layer 240, the second clad layer 250 and the second bonding layer 270 may include a p-InGaN layer, a p-GaN/AlGaN layer and a p-InGaN layer, respectively.

The pre-sacrificial layer 230 may be used to remove the second substrate 210. For example, an AlN layer may be initially formed and oxidized according to example embodiments as follows.

The second substrate 210 may be a sapphire substrate. A GaN-based semiconductor layer may be grown over the second substrate 210 using ELO or PE to prevent or reduce the lattice defect. Although not illustrated, an ELO or PENDEO second seed pattern may be formed over the second substrate 210. The second pattern may include a GaN-based III-V nitride semiconductor material. The second seed pattern may include a material selected from the group including GaN, $Al_xGa_{1-x}N$, where $0<x\leq1$, and $In_yAl_xGa_{1-y-x}N$, where $0<x\leq1$ and $0<y\leq1$. The second semiconductor layer 291 may be obtained by growing a GaN-based semiconductor material over a second base layer 220 based on a monolith or re-growth method. The second base layer 220 may be formed by being re-grown from the second seed pattern.

The second semiconductor layer 291 may be used to guide emitted light, and may have a ridge waveguide structure or a gain guide structure. For example, if the second semiconductor layer 291 is formed in the ridge waveguide structure, the second base layer 220 may be etched such that upper surface portions 220A of the second base layer 220 are exposed. As illustrated in FIG. 4B, those layers stacked on the second base layer 220 after etching are formed in stripes. FIG. 5 illustrates a premature second semiconductor layer 290 including these stack layers formed in stripes. The premature second semiconductor layer 290 formed in stripes may become a ridge part of the ridge waveguide structure.

Referring to FIG. 4C, the pre-sacrificial layer 230 (see FIG. 4B) may be oxidized to a sacrificial layer 231.

The sacrificial layer 231 may be used to separate the second substrate 210 and the second base layer 220 from the premature second semiconductor layer 290. The sacrificial layer 231 may include a material with beneficial wet etch characteristics allowing for a chemical lift-off effect. For example, the sacrificial layer 231 may include an $Al_2O_3$ layer, which may be obtained by exposing an AlN layer to oxygen at about 500° C. for about 1 minute. The sacrificial layer 231 may have a thickness greater than about 20 nm. The sacrificial layer 231 may or may not be formed, depending on the method of removing the second substrate 210.

Figure 6:
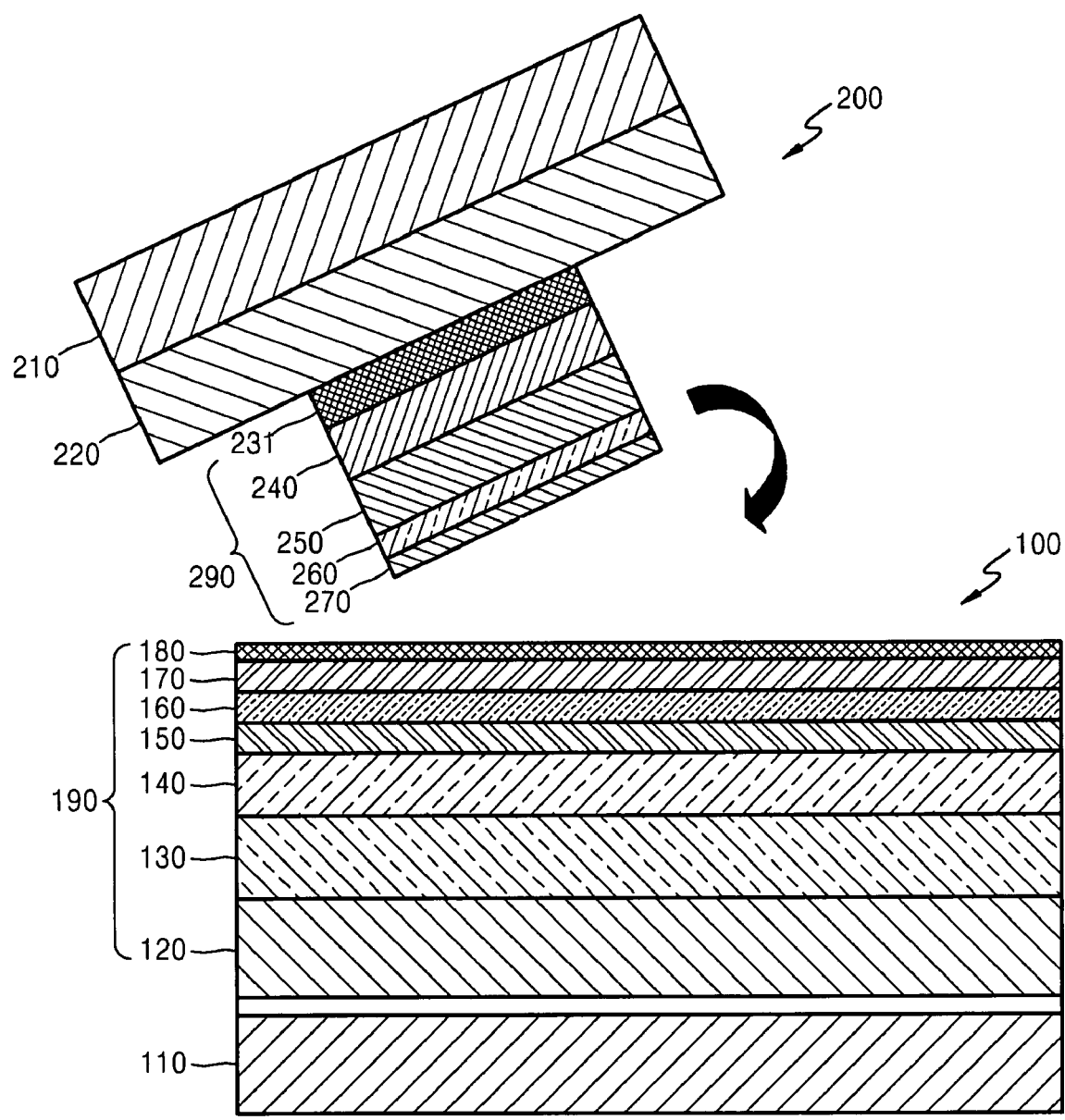
Figure 7:
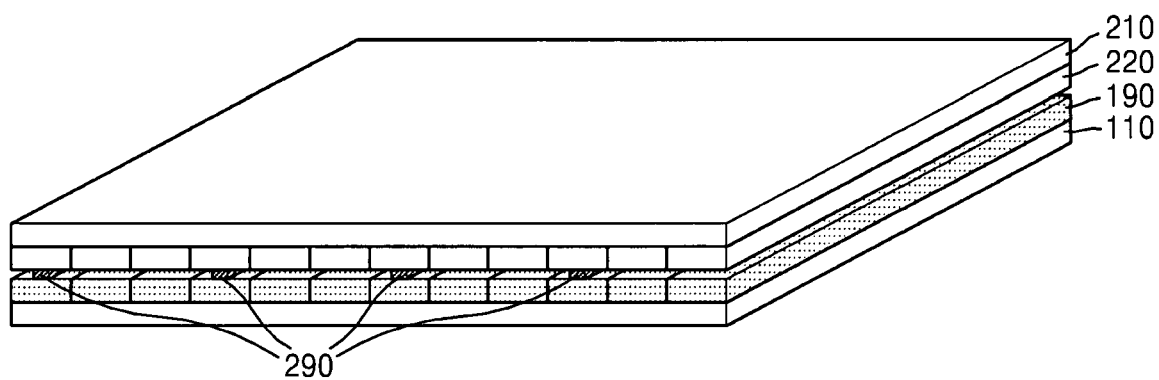

FIGS. 6 and 7 illustrate example processes for bonding the first and second semiconductor layers 190 and 291 with each other. As shown in FIG. 6, the second device 200 may be turned up-side-down and bonded to the first device 100. For example, a direct wafer-to-wafer bonding may be implemented at a temperature ranging from about 400° C. to about 1,050° C.

Figure 8:
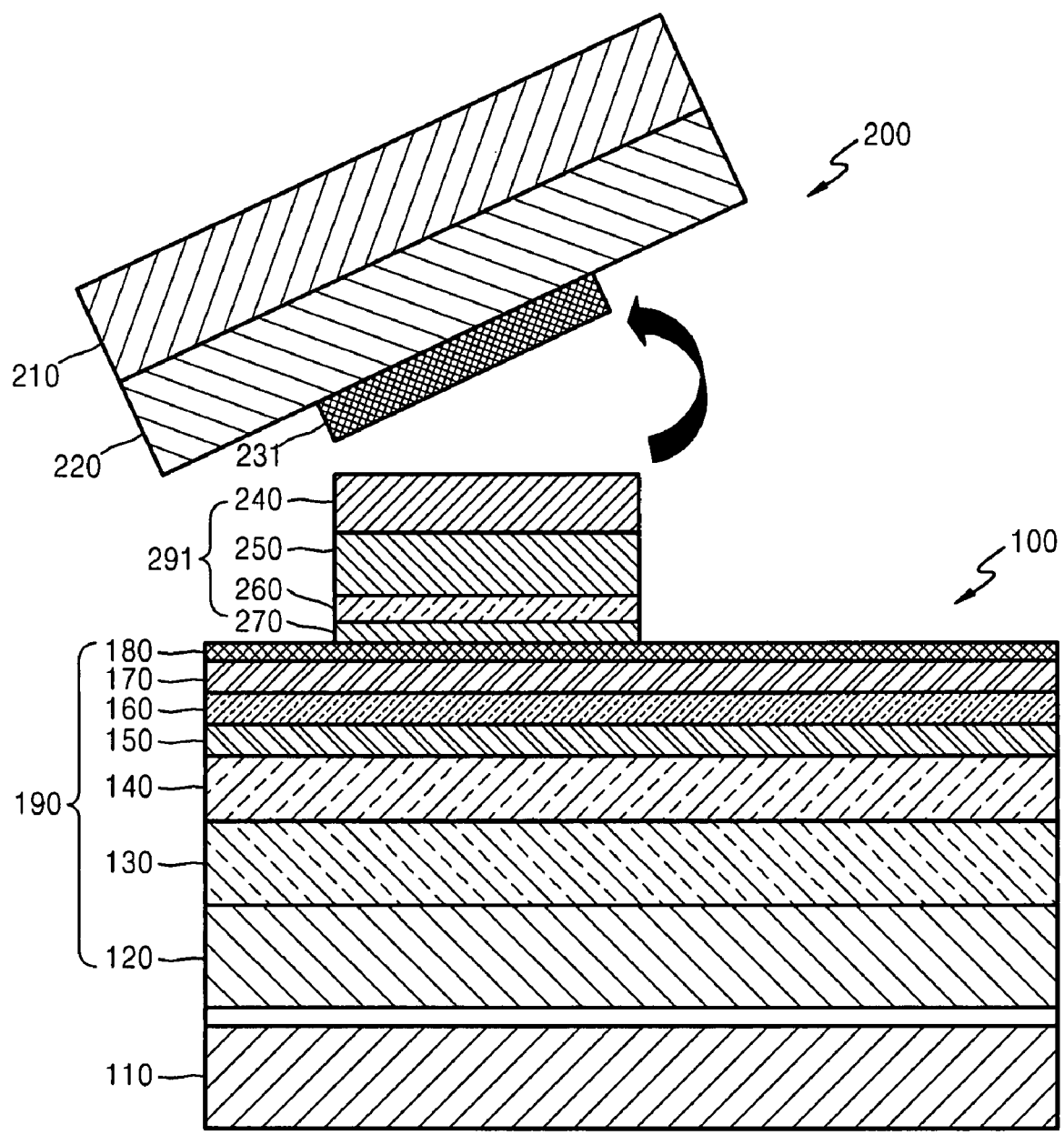
Figure 9:
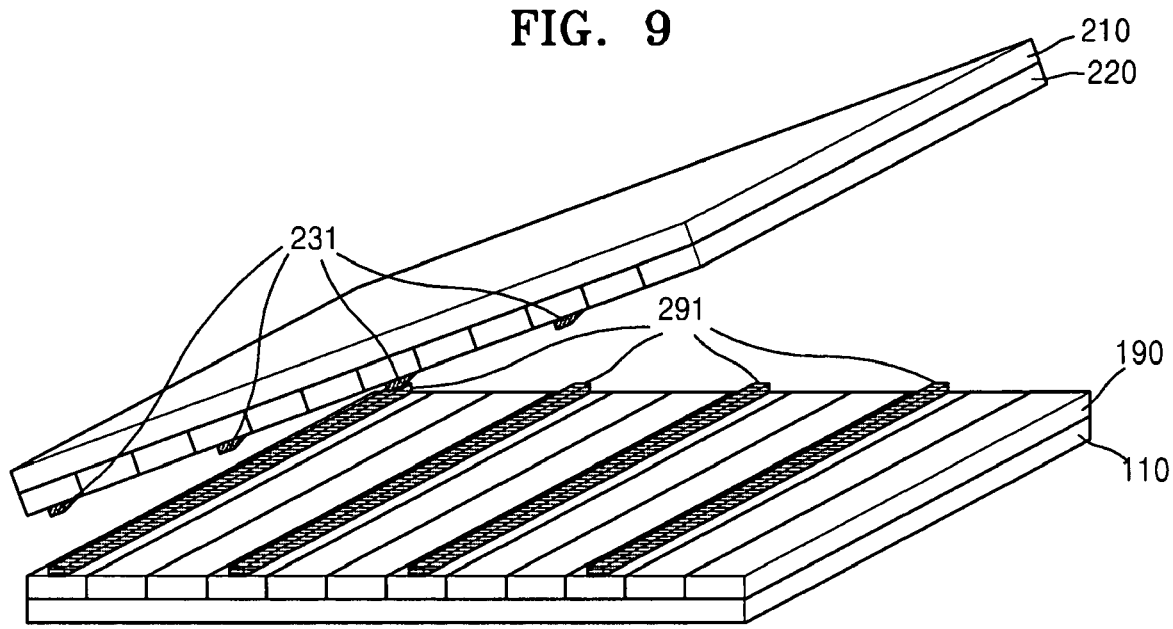

FIGS. 8 and 9 illustrate processes of separating the second substrate 210 from the second semiconductor layer 291.

The second substrate 210 and the second base layer 220 may be separated from the second semiconductor layer 291 using wet etching. The sacrificial layer 231, which may be an oxide layer interposed between the second base layer 220 and the second semiconductor layer 291, may be wet-etched, for example, using an etch solution of buffered oxide etchant (BOE) or HF. The second substrate 210 and the second base layer 220 may thereby be separated from the second semiconductor layer 291.

Wet etching may be one exemplary method of removing the second substrate 210 and the second base layer 220 from the second semiconductor layer 291. A laser lift-off (LLO) method, for example, may be employed as another removal method. If the LLO method is used, a laser may be beamed to a target to melt the contact surface between the second base layer 220 and the second semiconductor layer 291, so that the second substrate 210 and the second base layer 220 may be removed from the second semiconductor layer 291. The sacrificial layer 231 may be interposed between the second base layer 220 and the second semiconductor layer 291 to improve melting characteristics at the contact surface.

The first and second electrodes 300 and 310 of the semiconductor laser diode (see FIG. 1) may be formed after the removal of the second substrate 210 from the second semiconductor layer 291. The first electrode 300 may be formed on one side of the first semiconductor layer 190 in the course of forming the first semiconductor layer 190.

Thus, according to example embodiments, semiconductor laser diodes may be fabricated through processes of separately forming the first semiconductor layer that may be grown at lower temperatures (for example, an InGaN active layer) and the second semiconductor layer that may be grown at higher temperatures, and bonding the first and second semiconductor layers to each other.

As described above, the second semiconductor layer grown at higher temperatures may be fabricated through a separate process and bonded to the first bonding layer, which may enable a composition ratio of a material (for example, a material in the active later) that is likely to evaporate or diffuse at higher temperatures to be increased. Therefore, a laser diode with a relatively long wavelength may be fabricated without degrading the active layer, which may be a gain medium.

Because the first and second semiconductor layers may be fabricated separately from each other, generation of lattice defects caused by growth temperature differences and/or strain differences may be reduced. Certain limitations associated with the difficulty in doping Mg, which may be observed when the conventional p-type semiconductor layer is grown, may thereby be overcome according to example embodiments. Thus, in the second semiconductor layer, a sufficient amount of Mg may be doped.

The separate fabrication of the first and second semiconductor layers may allow adjusting the composition ratio of Al, and the thicknesses of the layers of the second semiconductor layer, without degrading the first semiconductor layer. Also, the separate fabrication of the first and second semiconductor layers may be advantageous for generating a mode of an oscillated laser beam.

While example embodiments have been particularly shown and described with reference to example embodiments thereof, it will be understood by those of ordinary skill in the art that various changes in form and details may be made therein without departing from the spirit and scope of the following claims.

What is claimed is:

1. A semiconductor laser diode, comprising:
a first semiconductor layer formed over a first substrate and emitting light; and
a second semiconductor layer guiding the emitted light
wherein the first and second semiconductor layers are bonded to each other, and
wherein the first semiconductor layer includes a first clad layer, a first waveguide layer, an active layer, a second waveguide layer, and a first bonding layer being formed over the first substrate in sequential order, and the second semiconductor layer includes a second bonding layer bonded to the first bonding layer and a second clad layer formed over the second bonding layer.

2. The semiconductor laser diode of claim 1, wherein the second semiconductor layer has one of a ridge waveguide structure or a gain guide structure.

3. The semiconductor laser diode of claim 1, wherein the second semiconductor layer further comprises a current shield layer interposed between the second bonding layer and the second clad layer.

4. The semiconductor laser diode of claim 1, wherein the first and second semiconductor layers include one selected from a group consisting of GaN-based III-V nitride semiconductors.

5. The semiconductor laser diode of claim 4, wherein the first semiconductor layer is formed in a structure including an n-AlGaN/GaN contact layer, an n-GaN clad layer, an n-GaN waveguide layer, an InGaN active layer, and a p-GaN waveguide layer being between the first substrate and the first bonding layer, and the second semiconductor layer is formed in a structure including the second bonding layer a p-AlGaN/GaN clad layer and a p-InGaN contact layer formed in sequential order, and
wherein the first bonding layer is formed of a p-InGaN and the second bonding layer is formed of a p-InGaN.

6. The semiconductor laser diode of claim 1, wherein the first substrate includes one selected from a group consisting of sapphire, GaN, SiC, GaAs, and InP.

7. The semiconductor laser diode of claim 6, wherein the first semiconductor layer further comprises a first base layer laterally grown from an ELO (epitaxial lateral overgrowth) or PENDEO seed pattern formed on the first substrate.

8. The semiconductor laser diode of claim 7, wherein the first base layer includes one selected from a group consisting of GaN, $Al_xGa_{1-x}N$, where $0<x\leq1$, and $In_yAl_xGa_{1-y-x}N$, where $0<x\leq1$ and $0<y\leq1$.

* * * * *